(12) United States Patent  
Saito

(10) Patent No.: US 7,535,157 B2  
(45) Date of Patent: May 19, 2009

(54) PIEZOELECTRIC ELEMENT, ACTUATOR DEVICE, LIQUID-JET HEAD, AND LIQUID-JET APPARATUS

(75) Inventor: Takeshi Saito, Matsumoto-shi, Nagano-ken (JP)

(73) Assignee: Seiko Epson Corporation, Tokyo (JP)

(*) Notice: Subject to any disclaimer, the term of this patent is extended or adjusted under 35 U.S.C. 154(b) by 0 days.

(21) Appl. No.: 11/851,196

(22) Filed: Sep. 6, 2007

(65) Prior Publication Data

US 2008/0062228 A1    Mar. 13, 2008

(30) Foreign Application Priority Data

Sep. 8, 2006 (JP) ............... 2006-243769  
Aug. 7, 2007 (JP) ............... 2007-205320

(51) Int. Cl.  
*H01L 41/047* (2006.01)  
*B41J 2/045* (2006.01)

(52) U.S. Cl. ............... 310/363; 310/365; 310/366; 347/68

(58) Field of Classification Search .......... 310/363–366  
See application file for complete search history.

(56) References Cited

U.S. PATENT DOCUMENTS 6,294,860 B1 * 9/2001 Shimada et al. ............. 310/328  
6,387,225 B1 * 5/2002 Shimada et al. ........ 204/192.18  
6,917,112 B2 * 7/2005 Basceri et al. ............. 257/769

FOREIGN PATENT DOCUMENTS

| JP | 09-129827 A | 5/1997 |
| JP | 11-151815 A | 6/1999 |
| JP | 11-207957 A | 8/1999 |
| JP | 11-348277 A | 12/1999 |
| JP | 2001-274472 A | 10/2001 |
| JP | 2003-264320 A | 9/2003 |
| JP | 2004-288548 A | 10/2004 |

* cited by examiner

*Primary Examiner*—Jaydi SanMartin  
(74) *Attorney, Agent, or Firm*—Sughrue Mion, PLLC

(57) ABSTRACT

A piezoelectric element includes: a lower electrode film provided on a substrate; a piezoelectric layer provided on the lower electrode film; and an upper electrode film provided on the piezoelectric layer, wherein the lower electrode film includes columnar crystals of platinum, and an oxide exists in the grain boundaries of the crystals of platinum.

9 Claims, 8 Drawing Sheets

PIEZOELECTRIC ELEMENT, ACTUATOR DEVICE, LIQUID-JET HEAD, AND LIQUID-JET APPARATUS

The entire disclosures of Japanese Patent Applications Nos. 2006-243769 filed Sep. 8, 2006 and 2007-205320 filed Aug. 7, 2007 are expressly incorporated by reference herein.

BACKGROUND

1. Technical Field

The present invention relates to a piezoelectric element formed of a lower electrode film, a piezoelectric layer made of a piezoelectric material, and an upper electrode film, to an actuator device including the piezoelectric element which can be flexurally deformed, and also to a liquid-jet head and a liquid-jet apparatus, each using the actuator device.

2. Related Art

As a piezoelectric element used for an actuator device and the like, there is a piezoelectric element in which a piezoelectric layer is sandwiched between two electrodes: lower and upper electrode films. The piezoelectric layer is made of a piezoelectric material, such as a crystallized piezoelectric ceramic, with an electromechanical transduction function. Moreover, as a device using an actuator device including a piezoelectric element, that is, an actuator device of a flexure vibration mode, there is a liquid-jet head that ejects a droplet from a nozzle orifice by utilizing the displacement of the piezoelectric element. A typical example of the liquid-jet head of this type is an ink-jet recording head. In the ink-jet recording head of this type, a part of a pressure-generating chamber, which communicates with a nozzle orifice for ejecting an ink droplet, is formed of a vibration plate. The vibration plate is deformed with a piezoelectric element to pressurize ink in the pressure-generating chamber, so that the ink droplet is ejected from the nozzle orifice.

A piezoelectric element used in an ink-jet recording head and the like may be fabricated in the following manner. Specifically, a piezoelectric layer and an upper electrode film are formed, by using a film-forming technique, over the entire surface of a substrate on which a lower electrode is provided. Then, the piezoelectric layer and the upper electrode film are cut into pieces, each having a shape corresponding to a pressure-generating chamber, by a lithography method, so that a piezoelectric element is formed (see JP-A-11-151815).

Furthermore, a lower electrode film is proposed to have a three-layer structure formed of, for example, an iridium layer, a platinum layer and another iridium layer (see JP-A-2001-274472).

In such a piezoelectric element used in an ink-jet recording head and the like, a problem, such as delamination, may occur when the piezoelectric element is repeatedly driven. In addition, since the lower electrode film has an insufficient rigidity, the characteristic as an electrode may be deteriorated due to the repetitive use.

Such problems exist not only in a piezoelectric element of an actuator device installed in a liquid-jet head such as an ink-jet recording head, but also in a piezoelectric element used in any other kind of device.

SUMMARY

An advantage of some aspects of the invention is to provide a piezoelectric element having an improved durability against repeated driving, which is achieved by enhancing rigidity and toughness of a lower electrode film thereof, and also to provide an actuator device, a liquid-jet head and a liquid-jet apparatus.

A first aspect of the invention provides a piezoelectric element including a lower electrode film, a piezoelectric layer and an upper electrode film. The lower electrode film is provided on a substrate. The piezoelectric layer is provided on the lower electrode film, and the upper electrode film is provided on the piezoelectric layer. In the piezoelectric element, the lower electrode film includes columnar crystals of platinum. In addition, an oxide exists in the grain boundaries of the crystals of platinum.

According to the first aspect, since the oxide exists in a segregated state in the grain boundaries of the platinum forming the lower electrode film, the rigidity and toughness of the lower electrode film is improved. As a result, the durability against degradation associated with repeated driving is improved.

A second aspect of the invention provides the piezoelectric element according to the first aspect, in which the oxide is titanium oxide.

According to the second aspect, since the oxide is titanium oxide ($TiO_x$), the toughness is further improved while an excellent adhesion with the platinum can be achieved.

A third aspect of the invention provides the piezoelectric element according to the first aspect, in which the lower electrode film includes a layer made of iridium oxide on the crystals of platinum.

According to the third aspect, a diffusion-preventive layer made of iridium is turned into the layer made of iridium oxide when the piezoelectric layer is crystallized. At this time, the diffusion-preventive layer prevents the components of the lower electrode film from diffusing into a piezoelectric precursor film, and concurrently prevents the component of the piezoelectric precursor film from diffusing into the lower electrode film. As a result, the piezoelectric element having excellent displacement characteristics can be obtained.

A fourth aspect of the invention provides the piezoelectric element according to the first aspect, in which a layer made of the oxide exists on the upper surface of the crystal of platinum.

According to the fourth aspect, the layer made of the oxide exists on the upper surface of the platinum. As a result, an excellent adhesion with the above layer can be obtained.

A fifth aspect of the invention provides the piezoelectric element according to the first aspect, in which the oxide exists less on the substrate side in the grain boundaries of the crystals of platinum, and exists more on the piezoelectric layer side in the grain boundaries of the crystals of platinum.

According to the fifth aspect, the oxide exists less on the substrate side in the grain boundaries of the platinum. Accordingly, the orientation of the platinum can be made further favorable. As a result, it is possible to make the growth of the piezoelectric layer further favorable.

A sixth aspect of the invention provides an actuator device including the piezoelectric element according to claim 1, which can be flexurally deformed.

According to the sixth aspect, it is possible to fabricate an actuator device with an improved durability while maintaining the favorable displacement characteristics of the piezoelectric element.

A seventh aspect of the invention provides the actuator device according to the sixth aspect further including a zirconium oxide layer, which constitutes a part of a vibration plate, on the lower side of the lower electrode film of the piezoelectric element.

According to the seventh aspect, the vibration plate is partly constituted of the zirconium oxide layer. This makes it possible to fabricate an actuator device with surely improved actuator performance and durability.

An eighth aspect of the invention provides the actuator device according to the seventh aspect, in which the piezoelectric element is formed by baking an adhesion layer, a platinum layer, an iridium layer, a titanium seed layer, and a piezoelectric precursor film. The adhesion layer is provided on the zirconium oxide layer. The platinum layer is provided on the adhesion layer. The iridium layer is provided on the platinum layer. The titanium seed layer is provided on the iridium layer. The piezoelectric precursor film is provided on the titanium seed layer, and is to serve as the piezoelectric layer.

According to the eighth aspect, it is possible to fabricate an actuator device having favorable adhesion between the lower electrode film and the zirconium oxide, which constitutes a part of the vibration plate, and concurrently having favorable adhesion between the lower electrode film and the piezoelectric layer.

A ninth aspect of the invention provides a liquid-jet head including the actuator device according to the sixth aspect, and a passage-forming substrate. The passage-forming substrate is provided with the actuator device on one surface side of the passage-forming substrate. A pressure-generating chamber is formed in the passage-forming substrate, and communicates with a nozzle orifice for ejecting a droplet.

According to the ninth aspect, it is possible to fabricate a liquid-jet head having an improved durability as well as favorable ejecting characteristics of droplets.

A tenth aspect of the invention provides a liquid-jet apparatus including the liquid-jet head according to the ninth aspect.

According to the tenth aspect, it is possible to fabricate a liquid-jet apparatus having excellent reliability and durability.

BRIEF DESCRIPTION OF THE DRAWINGS

The invention will be described with reference to the accompanying drawings, wherein like numbers reference like elements.

FIG. 3A is a cross-sectional view schematically showing a principal part of the recording head according to Embodiment 1, while

DESCRIPTION OF EXEMPLARY EMBODIMENTS

Hereinafter, the invention will be described in detail referring to embodiments.

Embodiment 1

Figure 1:
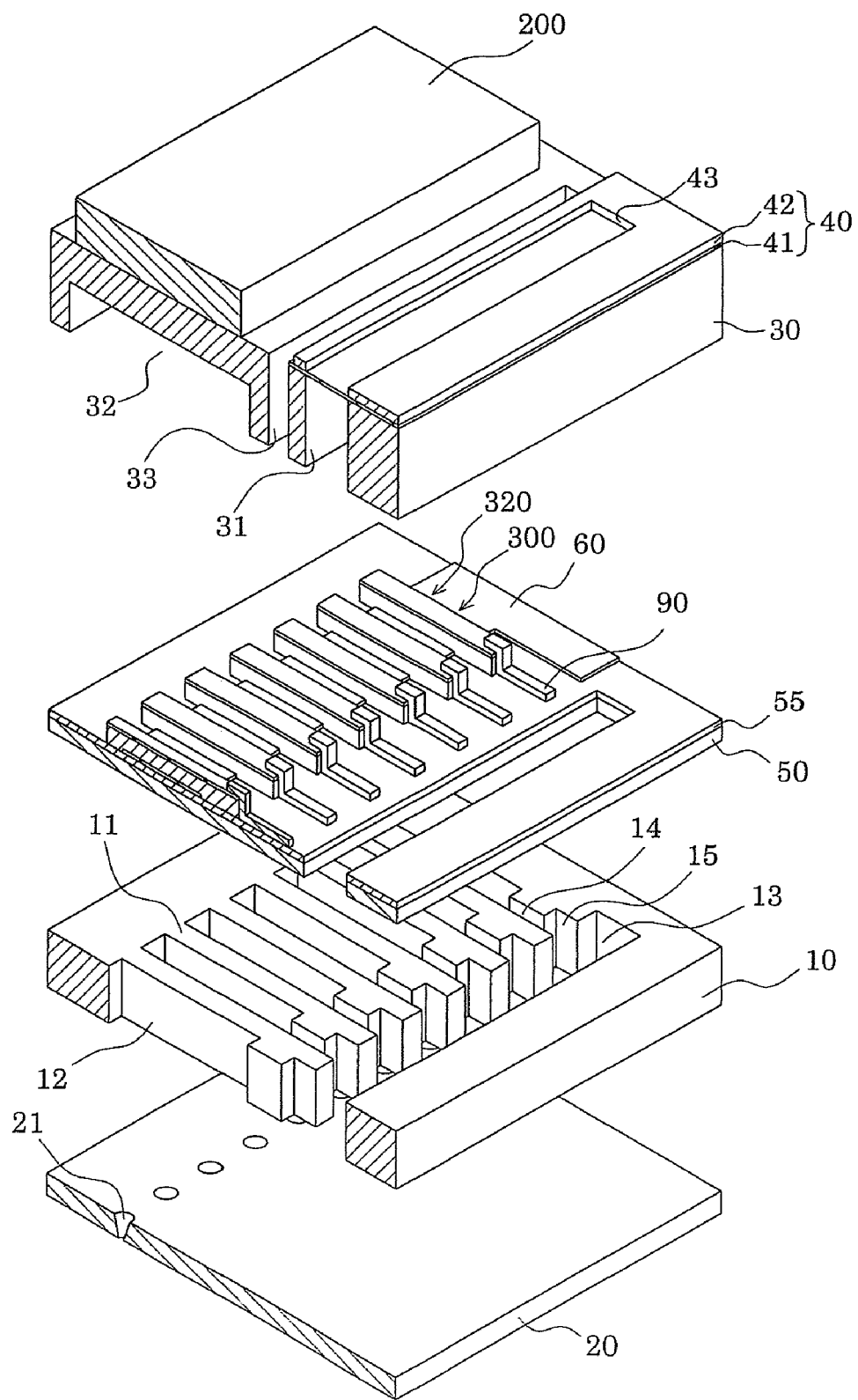
FIG. 1 is an exploded perspective view showing a schematic configuration of a recording head according to Embodiment 1.
Figure 2A:
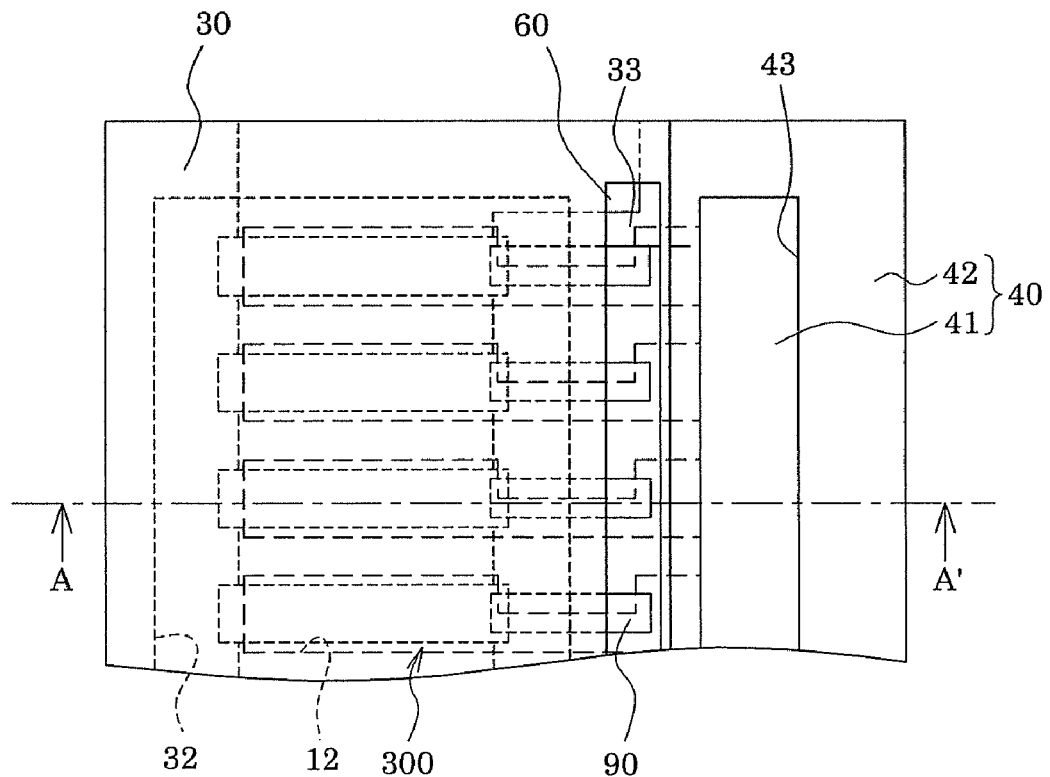
FIGS. 2A and 2B are respectively a plan view and a cross-sectional view of the recording head according to Embodiment 1.

FIG. 1 is an exploded perspective view showing a schematic configuration of an ink-jet recording head that is an example of a liquid-jet head according to Embodiment 1 of the invention. FIG. 2A is a plan view of the ink-jet recording head of FIG. 1, and FIG. 2B is a cross-sectional view taken along the line A-A' in FIG. 2A.

Figure 2B:
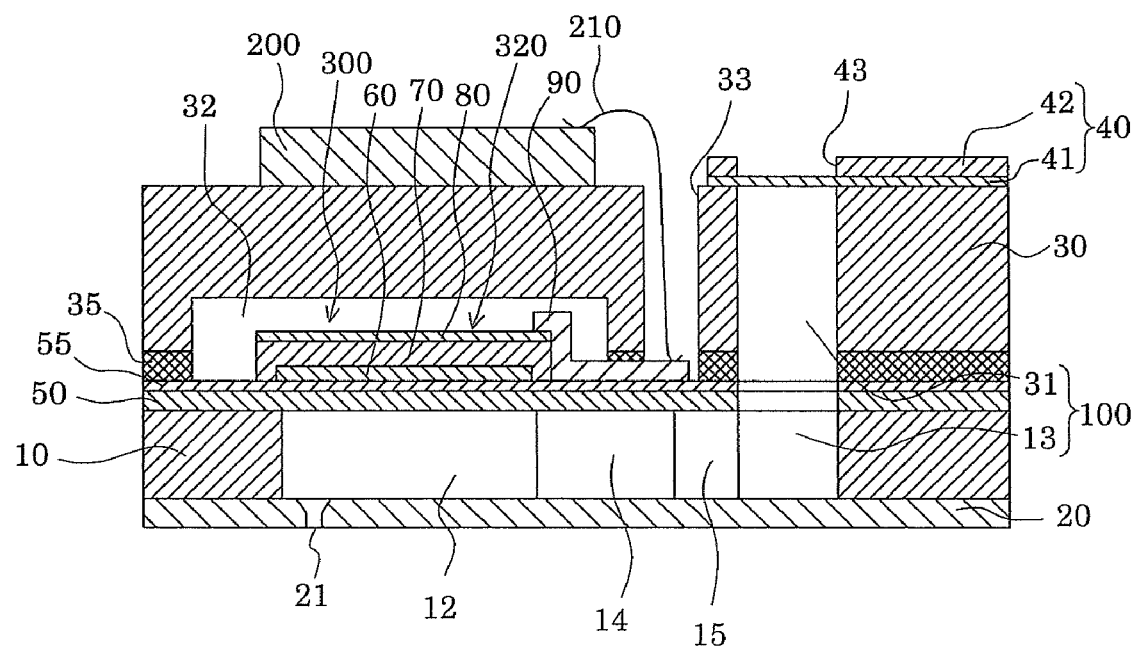

Embodiment 1 is configured as shown in FIGS. 1, 2A and 2B. A passage-forming substrate 10 is made of a single-crystal silicon substrate with the (110) crystal plane orientation. On one surface of the passage-forming substrate 10, an elastic film 50 is formed. The elastic film 50 is made of silicon dioxide ($SiO_2$) formed by means of thermal oxidation in advance, and has a thickness of 0.5 μm to 2.0 μm. In the passage-forming substrate 10, a plurality of pressure-generating chambers 12 are formed in parallel to one another in the width direction thereof. In addition, a communicating portion 13 is formed in a region in the passage-forming substrate 10 on the outer side, in the longitudinal direction, of the pressure-generating chambers 12. An ink supply path 14 and a communicating path 15 are provided to each pressure-generating chamber 12. The communicating portion 13 communicates with each pressure-generating chamber 12 through the corresponding ink supply path 14 and the corresponding communicating path 15. The communicating portion 13 also communicates with a reservoir portion 31 of a protective plate 30, which is to be described later, to constitute a part of a reservoir 100, which serves as a common ink chamber for the pressure-generating chambers 12. Each ink supply path 14 is formed to have a width smaller than that of each pressure-generating chamber 12, and thus maintains, at a constant level, the passage resistance of ink flowing from the communicating portion 13 into each pressure-generating chamber 12. Note that, in this embodiment, each ink supply path 14 is formed in a manner of narrowing down the width of a corresponding passage from one side surface. However, each ink supply path 14 may be formed in a manner of narrowing down the width of the corresponding passage from the two side surfaces. Alternatively, each ink supply path 14 may be formed in a manner of narrowing down, not the width of, but the thickness of, the corresponding passage. In addition, the communicating paths 15 are formed in a manner of extending compartment walls 11 toward the communicating portion 13, the compartment walls 11 being the two side surfaces, in the width direction, of each pressure-generating chamber 12. Accordingly, each communicating path 15 defines a space between the communicating portion 13 and the corresponding ink supply path 14. In other words, in the passage-forming substrate 10, the ink supply paths 14 and the communicating paths 15 are defined by the plurality of compartment walls 11. In addition, each ink supply path 14 has a cross-sectional area, in the width direction, smaller than that of each pressure-generating chamber 12. Moreover, each communicating path 15 communicates with the corresponding ink supply path 14, and has a cross-sectional area, in the width direction, larger than that of each ink supply path 14.

In addition, a nozzle plate 20, in which nozzle orifices 21 are drilled, is fixed to the opening surface side of the passage-forming substrate 10 with an adhesive agent, a thermal adhesive film or the like. Each nozzle orifice 21 communicates with a vicinity of an end portion of the corresponding pressure-generating chamber 12, on the opposite side to the ink supply paths 14. Note that, the nozzle plate 20 is made of a glass ceramic material, a single-crystal silicon substrate, stainless steel or the like, which has a thickness of, for example, 0.01 mm to 1 mm, a linear expansion coefficient of, for example, 2.5 to 4.5 ($\times 10^{-6}$/° C.) at a temperature of 300° C. or less.

On the other hand, the elastic film 50, having a thickness of, for example, approximately 1.0 μm, is formed, as described above, on the passage-forming substrate 10 which is the opposite side to the opening surface thereof. On the elastic film 50, an insulation film 55, having a thickness of, for example, approximately 0.4 μm, is formed. Moreover, on the insulation film 55, a lower electrode film 60, piezoelectric layers 70, and upper electrode films 80 are stacked by means of a process to be described later, so as to constitute piezoelectric elements 300. The lower electrode film 60 has a thickness of, for example, approximately 0.2 μm. Each piezoelectric layer 70 has a thickness of, for example, approximately 1.1 μm, while each upper electrode film 80 has a thickness of, for example, approximately 0.05 μm. Here, each piezoelectric element 300 is a part including the lower electrode film 60, the corresponding piezoelectric layer 70 and the corresponding upper electrode film 80. In general, the piezoelectric element 300 is formed by using any one of the two electrodes of the piezoelectric element 300 as a common electrode, and then by patterning the other one of these electrodes and the piezoelectric layer 70 for each pressure-generating chamber 12. Parts which are formed of any one of the electrodes and the piezoelectric layers 70, and which are thus patterned, are termed here as piezoelectric active portions 320. In each piezoelectric active layer 320, piezoelectric strain occurs when a voltage is applied to the two electrodes. In this embodiment, the lower electrode film 60 is used as the common electrode of the piezoelectric elements 300, while the upper electrode films 80 are used as individual electrodes of the corresponding piezoelectric elements 300. However, the functions of the lower electrode film 60 and of the upper electrode films 80 may be reversed as appropriate to meet the conditions of a drive circuit 200 and wirings. In any case, the piezoelectric active portion 320 is formed for each pressure-generating chamber 12. In addition, the piezoelectric elements 300 and a vibration plate, which is displaced by the driving of the piezoelectric elements 300, are here collectively called an actuator device. Note that, in this embodiment, the elastic film 50, the insulation film 55 and the lower electrode film 60 function as the vibration plate. However, it is also possible to form the vibration plate with only the lower electrode film 60 without providing the elastic film 50 and the insulation film 55 thereto.

Figure 3A:
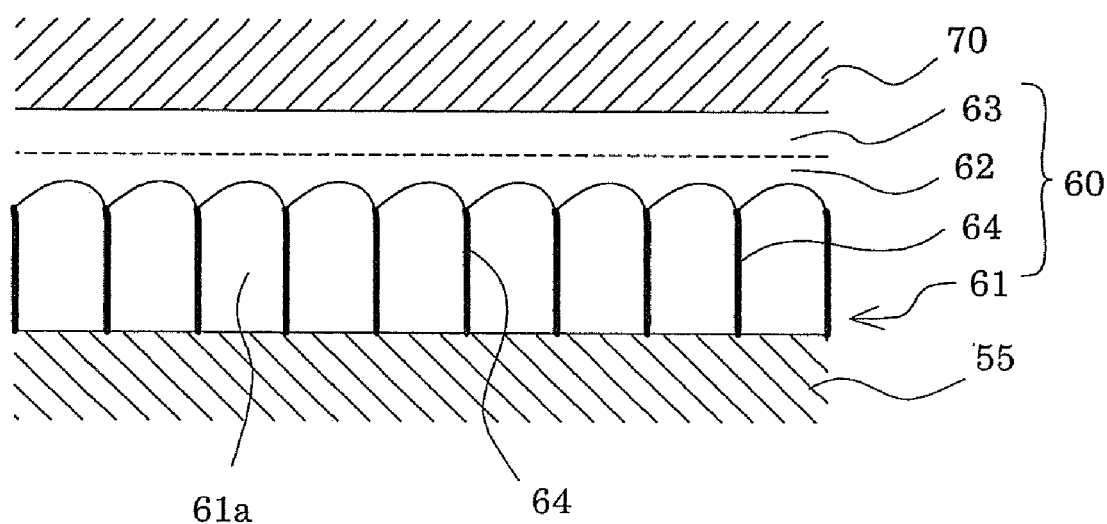

The lower electrode film 60 of this embodiment includes a platinum (Pt) layer 61, a titanium oxide ($TiO_x$) layer 62 and an iridium oxide ($IrO_x$) layer 63, as illustrated in FIG. 3A showing a schematic cross-section of a principal part. The platinum layer 61 is formed of columnar crystals (hereinafter referred to as columnar crystal grains 61a), and includes grain boundary layers 64 each made of titanium oxide. The grain boundary layers 64 extend continuously from the titanium oxide layer 62 in grain boundaries of the columnar crystal grains 61a of the platinum layer 61.

These layers are formed by thermal diffusion when a piezoelectric precursor film 71 is baked to form the piezoelectric layer 70, after the corresponding films are formed by a fabricating process to be described later. The illustrated structure of these layers is only an illustration of the result of observation using a microscope, and may be difficult to clearly figure out, and the boundary surfaces in the layer structure may not be clear. However, the layer structure of this embodiment, which is shown in FIG. 3A, is formed by the fabricating process to be described later.

Figure 4A:
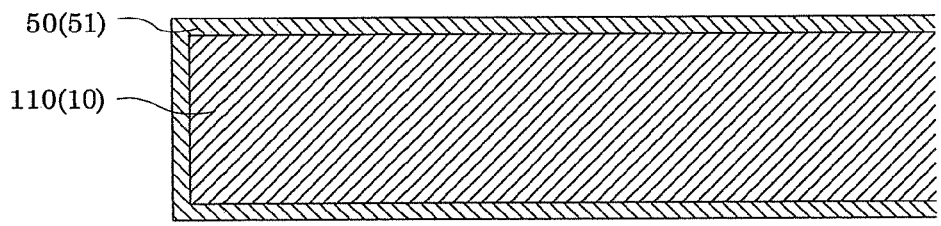
FIGS. 4A to 4D are cross-sectional views each showing a method of fabricating the recording head according to Embodiment 1.

Specifically, the lower electrode film 60 of this embodiment is formed in the following manner. As shown in FIG. 4C to be referred to later for describing the fabricating process, an adhesion layer 65, a platinum layer 66 and a diffusion-preventive layer 67 are sequentially formed before the piezoelectric layers 70 are formed. The adhesion layer 65 is made of titanium, and is provided on the insulation film 55. The platinum layer 66 is provided on the adhesion layer 65, and the diffusion-preventive layer 67 is made of iridium, and is provided on the platinum layer 66. Thereafter, these layers are thermally treated to be formed into the lower electrode film 60 at the same time as the piezoelectric precursor film 71 is baked and crystallized to form the piezoelectric layer 70 in the fabricating process to be described in detail later.

The lower electrode film 60 formed in this manner includes the grain boundary layers 64 and the titanium oxide layer 62. When the titanium that forms the adhesion layer 65 is diffused into the grain boundaries of the columnar crystal grains 61a of the platinum layer 61 at baking, the grain boundary layers 64 are formed therein in the segregated state. The titanium oxide layer 62 is formed on the upper surface of the platinum layer 61. As described above, since the platinum layer 61 and the columnar crystal grains 61a constituting the platinum layer 61 are surrounded by the titanium oxide, the rigidity and toughness of the lower electrode film 60 are enhanced. Moreover, a favorable adhesion of the lower electrode film 60 and the insulation film 55 made of zirconium oxide are obtained. Furthermore, the platinum layer 61 and the iridium oxide layer 63 adhere tightly to each other with the titanium oxide layer 62 in between.

In this embodiment, the adhesion layer 65 is made of titanium (Ti) having a thickness of, for example, 10 nm to 50 nm. However, the adhesion layer 65 may include, as a main component, at least one element selected from the group consisting of chromium (Cr), tantalum (Ta), zirconium (Zr) and tungsten (W). In this case, a metal other than titanium is diffused at the time of baking the piezoelectric precursor film 71. As a result, oxide layers of the metal used instead of titanium are formed in the segregated state, in the grain boundaries of the columnar crystal grains 61a of the platinum layer 61, and on the upper surface of the platinum layer 61.

In addition, the diffusion-preventive layer 67 is made of iridium (Ir) in this embodiment. However, it is also possible to obtain the same effect by employing, as the diffusion-preventive layer 67, a layer including at least one element selected from the group consisting of palladium (Pb), rhodium (Rh), ruthenium (Rh) and osmium (Os), as a main component. It goes without saying that, when a metal other than iridium is used, a layer made of the oxide of the used metal is formed, instead of the iridium oxide layer 63, in the upper portion of the lower electrode film 60.

Moreover, the piezoelectric layer 70 is a crystalline film with a perovskite structure, which is formed on the lower electrode film 60, and which is made of a ferroelectric ceramic material that exhibits an electromechanical transduction effect. As the material of the piezoelectric layer 70, preferably used are, for example, a ferroelectric-piezoelectric material, such as lead zirconate titanate (PZT), and a material obtained by adding a metal oxide such as niobium oxide, nickel oxide or magnesium oxide to a ferroelectric-piezoelectric material. Specifically, it is possible to use lead titanate (PbTiO$_3$), lead zirconate titanate (Pb(Zr,Ti)O$_3$), lead zirconate (PbZrO$_3$), lead titanate lanthanum ((Pb,La),TiO$_3$), lead lanthanum zirconate titanate ((Pb,La) (Zr,Ti)O$_3$), lead magnesium niobate zirconium titanate (Pb(Zr,Ti) (Mg,Nb)O$_3$) or the like. Each piezoelectric layer 70 is formed to have a thickness that is as thin as possible but not so thin that a crack is caused in the fabricating process, and concurrently the piezoelectric layer 70 is thick enough to exhibit sufficient displacement characteristics. For example, in this embodiment, the piezoelectric layer 70 is formed to have a thickness around 1 μm to 2 μm.

Moreover, a lead electrode 90, formed of, for example, gold (Au), is connected to each upper electrode film 80, which is the individual electrode of the corresponding one of the piezoelectric elements 300. Each lead electrode 90 is led out from a vicinity of an end portion, on the ink supply path 14 side, of the corresponding upper electrode film 80, and extends onto the insulation film 55.

The protective plate 30 is bonded, with an adhesive agent 35, to the top of the passage-forming substrate 10 on which the piezoelectric elements 300 are formed. In other words, the protective plate 30 is bonded to the tops of the lower electrode film 60, the elastic film 50 and the lead electrodes 90. The protective plate 30 includes the reservoir portion 31, which constitutes at least apart of the reservoir 100. In this embodiment, the reservoir portion 31 is formed in a manner of penetrating the protective plate 30 in the thickness direction thereof, and extending in the width direction of the pressure-generating chambers 12. As described above, the reservoir portion 31 communicates with the communicating portion 13 of the passage-forming substrate 10 to constitute the reservoir 100, which serves as the common ink chamber for the pressure-generating chambers 12.

In addition, a piezoelectric element holding portion 32 is formed in a region, facing the piezoelectric elements 300, of the protective plate 30. The piezoelectric element holding portion 32 has space large enough to allow the piezoelectric elements 300 to operate. It is only necessary that the piezoelectric element holding portion 32 have space large enough to allow the piezoelectric elements 300 to operate. The space may be hermetically sealed, or the space may not be hermetically sealed.

As the material of the protective plate 30, preferably used is a material having substantially the same thermal expansion coefficient as that of the passage-forming substrate 10, for example, glass or a ceramic material. In this embodiment, the protective plate 30 is made of the single-crystal silicon substrate which is the same material as that of the passage-forming substrate 10.

In the protective plate 30, a penetrated hole 33 is formed to penetrate the protective plate 30 in the thickness direction thereof. A vicinity of the end portion of the lead electrode 90, which is led out from each piezoelectric element 300, is exposed to the inside of the penetrated hole 33.

In addition, the drive circuit 200, which drives the piezoelectric elements 300 arranged in parallel to one another, is fixed on the protective plate 30. As the drive circuit 200, it is possible to use a circuit plate, a semiconductor integrated substrate (IC) or the like. The drive circuit 200 and each lead electrode 90 are electrically connected to each other with connection wiring 210, which is formed of a conductive wire such as a bonding wire.

Moreover, a compliance plate 40, constituted of a sealing film 41 and a fixing plate 42, is joined onto the protective plate 30. The sealing film 41 is made of a flexible material with a low rigidity (for example, a polyphenylene sulfide (PPS) film with a thickness of 6 μm). One side of the reservoir portion 31 is sealed with the sealing film 41. Meanwhile, the fixing plate 42 is made of a hard material such as a metal (for example, stainless steel (SUS) or the like with a thickness of 30 μm). In a region, facing the reservoir 100, of the fixing plate 42, an opening portion 43 is formed by removing the corresponding part of the fixing plate 42 completely in the thickness direction. Accordingly, one side of the reservoir 100 is sealed by only the flexible sealing film 41.

In the ink-jet recording head of this embodiment, ink is taken in the ink-jet recording head through an ink introduction port which is connected to unillustrated external ink supply means, so that the inside of the ink-jet recording head, from the reservoir 100 to the nozzle orifices 21, is filled with the ink. Thereafter, in accordance with a recording signal from the drive circuit 200, a voltage is applied between the lower electrode film 60 and the upper electrode film 80, which correspond to each pressure-generating chamber 12. This causes the elastic film 50, the insulation film 55, the lower electrode film 60 and the corresponding piezoelectric layer 70 to be flexurally deformed, so that the pressure in the pressure-generating chamber 12 is increased. Eventually, an ink droplet is ejected from the corresponding nozzle orifice 21.

Hereinafter, a method of fabricating the above-mentioned ink-jet recording head will be described with reference to FIG. 4A to FIG. 7C. Note that, each of FIG. 4A to FIG. 7C is a cross-sectional view taken along the longitudinal direction of the pressure-generating chamber 12. First, as shown in FIG. 4A, a wafer 110 for a passage-forming substrate, which is a silicon wafer, is thermally oxidized in a diffusion furnace at a temperature of approximately 1100° C. so as to form a silicon dioxide film 51, which is made of silicon dioxide (SiO$_2$), and which constitutes the elastic film 50, on the surface of the wafer 110. Note that, in this embodiment, a silicon wafer having a relatively large thickness of approximately 625 μm, and having a high rigidity, is used as the wafer 110 for the passage-forming substrate.

Figure 4B:
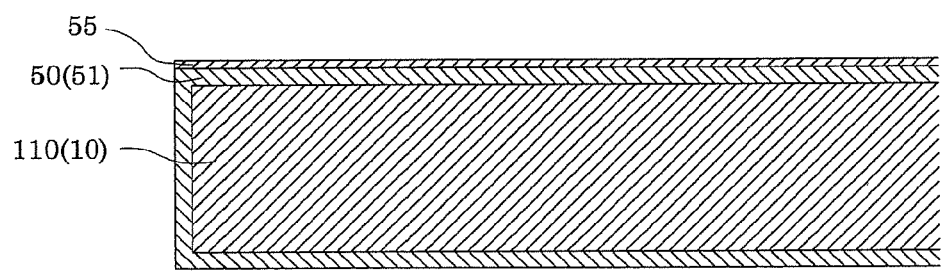
Figure 4C:
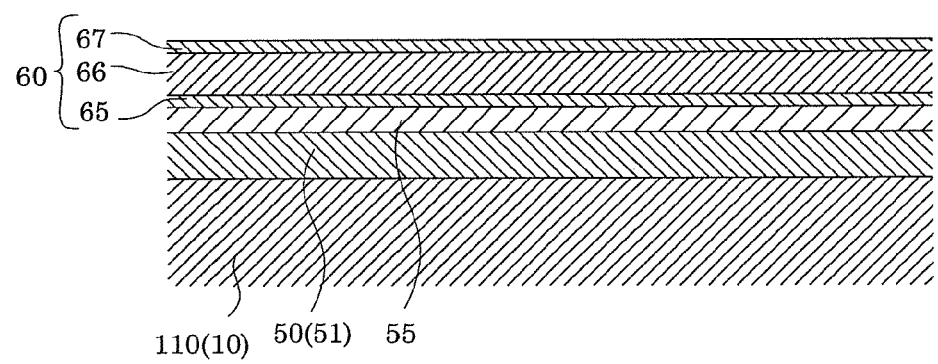

Next, as shown in FIG. 4B, the insulation film 55, which is made of zirconium oxide, is formed on the elastic film 50 (the silicon dioxide film 51). Specifically, a zirconium (Zr) layer is first formed on the elastic film 50 (the silicon dioxide film 51) by a sputtering method or the like. Then, this zirconium layer is thermally oxidized in a diffusion furnace at a temperature of, for example, 500° C. to 1200° C., so that the insulation film 55 made of zirconium oxide (ZrO$_2$) is formed.

Thereafter, as shown in FIG. 4C, the adhesion layer 65 made of titanium, the platinum layer 66, and the diffusion-preventive layer 67 made of iridium, are sequentially deposited to form the lower electrode film 60. Specifically, the adhesion layer 65, which is made of titanium (Ti), and which has a thickness of 20 nm, is first formed on the insulation film 55. The provision of the adhesion layer 65 in the lowermost layer of the lower electrode film 60 enhances the adhesion between the insulation film 55 and the lower electrode film 60.

Subsequently, the platinum layer 66 is formed on the adhesion layer 65. The platinum layer 66 maybe formed by, for example, a sputtering method. However, the method of forming the platinum layer 66 is not limited to the sputtering method, and may be a CVD (chemical vapor deposition) method or the like.

Here, it is necessary that the platinum layer 66 be formed of columnar crystals each extending in the thickness direction. For favorably forming the grain boundary layers 64 in the grain boundaries, the platinum layer 66 is preferably formed of the columnar crystals as uniform and well-oriented as possible. For forming the platinum layer 66 of such uniform and well-oriented columnar crystals, it is preferable that the sputtering be performed at a low pressure of 0.1 Pa or less, for example. It was also found out in the experiment that it is more preferable to set the pressure at the time of sputtering on the adhesion layer 65 to, for example, 0.1 Pa or less. This makes it possible to make the columnar crystals of the platinum layer 66 more favorable.

Note that, the platinum layer 66 including such columnar crystals is effective in causing the piezoelectric layers 70, which will be described later, to have a priority orientation of (100), for example.

The lower electrode film 60 is thermally treated at the same time as the piezoelectric precursor film 71 is baked and crystallized to form the piezoelectric layer 70 to be described later in detail. In this embodiment, the platinum layer 66 and the diffusion-preventive layer 67 are formed on the adhesion layer 65. Accordingly, when the metal, titanium in this embodiment, which constitutes the adhesion layer 65, is diffused while oxidized to the upper surface side of the platinum layer 61 through the grain boundaries of the columnar crystal grains 61a forming the platinum layer 61. At this time, the grain boundary layers 64, in which titanium oxide ($TiO_x$) made by the oxidation exists in the segregated state, are formed, while the titanium oxide layer 62 is formed on the upper surface side of the platinum layer 61. The adhesion layer 65 in the lowermost layer of the lower electrode film 60 is diffused and oxidized with the heat generated when the piezoelectric precursor film 61 is baked to be crystallized. This makes it easy to cause an oxide such as titanium oxide to exist in the segregated state in the grain boundaries of the columnar crystal grains 61a of the platinum layer 61. As a result, it is possible to enhance the rigidity and toughness of the lower electrode film 60, and to thus improve durability against degradation associated with repeated operations. Moreover, by causing the titanium oxide ($TiO_x$), functioning as an adhesive metal, to exist in the segregated state in the grain boundaries of the platinum layer 61, the upper and lower layers of the lower electrode film 60 are joined to each other with the titanium oxide. As a result, there also is an effect on the improvement in the adhesion between the upper and lower layers of the lower electrode film 60.

Here, it is preferable that the grain boundary layers 64, which exist in the grain boundaries of the columnar crystal grains 61a of the platinum layer 61, be as little as possible on the insulation film 55 side. When a large amount of the grain boundary layers 64 exist in the grain boundaries of the columnar crystal grains 61a close to the insulation film 55, the crystal orientation of the platinum layer 61 is disturbed. Accordingly, the platinum layer 61 is inhibited from having a priority orientation of (111), resulting in a tendency that the growth of the piezoelectric layer 70 is inhibited.

Figure 3B:
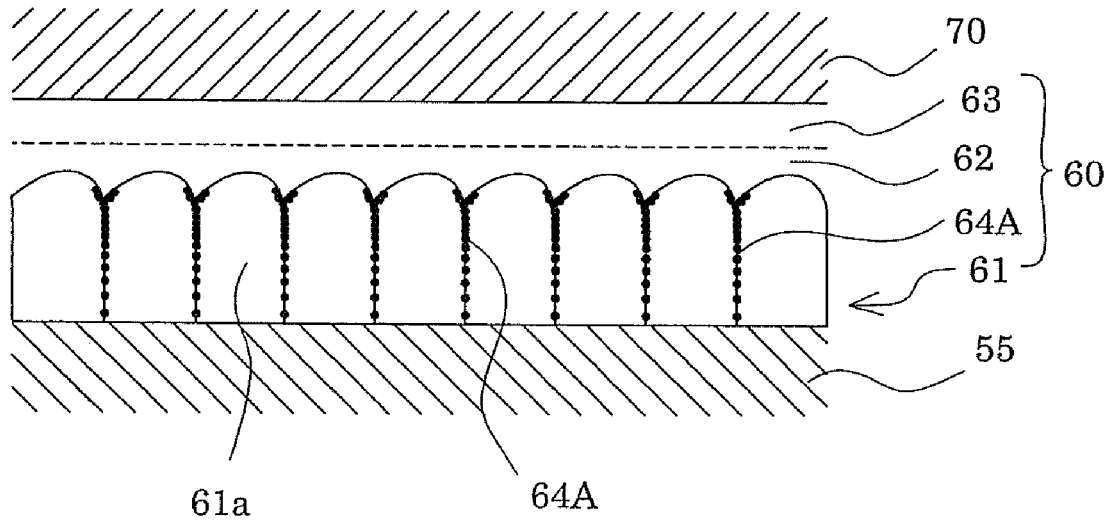
FIG. 3B is a cross-sectional view schematically showing a principal part of a recording head according to a modified embodiment.

For this reason, it is preferable to form grain boundary layers 64A as shown in FIG. 3B. Specifically, in FIG. 3B, the grain boundary layers 64A exist, in the grain boundaries of the columnar crystal grains 61a of the platinum layer 61, less on the side close to the insulation film 55, but more on the piezoelectric layer 70 side. Here, the grain boundary layers 64A are formed in the following manner. First, the adhesion layer 65 is diffused and oxidized with the heat generated when the piezoelectric precursor film 71 is baked to be crystallized. Then, an oxide such as titanium oxide is segregated in the grain boundaries of the columnar crystal grains 61a of the platinum layer 61, and thereby the grain boundary layers 64A are formed. The higher the temperature for the thermal treatment, the more likely the metal of the adhesion layer 65 is to be diffused and oxidized. For this reason, as the temperature for the thermal treatment is increased, the grain boundary layers 64A, existing less on the insulation film 55 side, but more on the piezoelectric layer 70 side, are more likely to be formed.

Next, the diffusion-preventive layer 67 is formed on the grain boundary layers 64. As a result, the lower electrode film 60, constituted of the adhesion layer 65, the platinum layer 66 and the diffusion-preventive layer 67, is formed. Note that, when the piezoelectric layer 70 is formed by baking and crystallizing the piezoelectric precursor film 71 in a later process, the diffusion-preventive layer 67 prevents the components of the adhesion layer 65 and the platinum layer 66 from diffusing in the piezoelectric layer 70, and also prevents the component of the piezoelectric layer 70 from diffusing in the lower electrode film 60. In this embodiment, the diffusion-preventive layer 67 is formed of iridium (Ir) to have a thickness of 5 nm to 20 nm. However, as described earlier, it is also possible to form the diffusion-preventive layer 67 of at least one element selected from the group consisting of palladium (Pb), rhodium (Rh), ruthenium (Rh) and osmium (Os) as the main component.

Figure 4D:
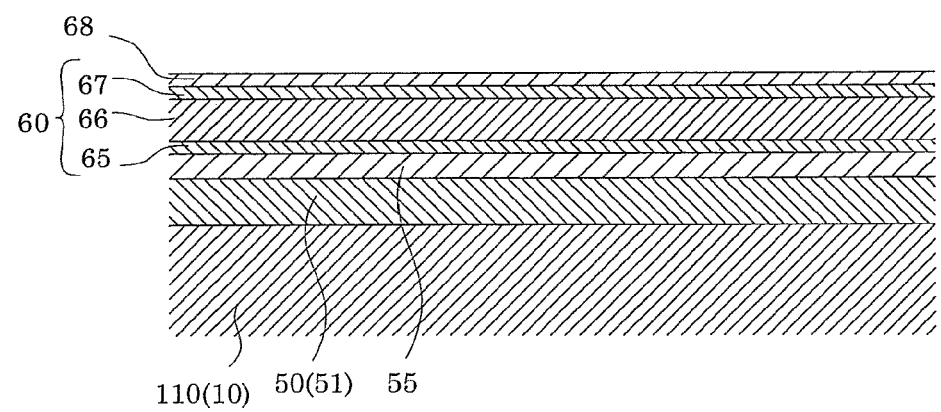

Thereafter, as shown in FIG. 4D, a titanium seed layer 68 made of titanium (Ti) is formed on the lower electrode film 60. This titanium seed layer 68 should be formed to have a thickness of 3.5 nm to 5.5 nm. Note that, it is preferable that the thickness of the titanium seed layer 68 be 4.0 nm. In this embodiment, the titanium seed layer 68 is formed to have a thickness of 4.0 nm.

In addition, it is preferable that the film density (the density of Ti) of the titanium seed layer 68 thus formed be as high as possible, and desirably be at least 4.5 g/cm$^3$. A higher film density of the titanium seed layer 68 leads to a smaller thickness of an oxide layer that is to be formed on the surface of the titanium seed layer 68 as time elapses, resulting in a favorable growth of the crystals of the piezoelectric layer 70. Note that, the film density of the titanium seed layer 68 is determined only in accordance with the film-forming conditions, regardless of the thickness of the titanium seed layer 68. Moreover, it is preferable that the titanium seed layer 68 be amorphous. Specifically, it is preferable that the X-ray diffraction intensity (XRD intensity) of the titanium seed layer 68, in particular, the X-ray diffraction intensity of the (002) plane, be substantially 0. This is because of the following reason. When the titanium seed layer 68 is amorphous, the film density of the titanium seed layer 68 is high, leading to a small thickness of the oxide layer that is to be formed on the surface of the titanium seed layer 68. As a result, it is possible to cause the crystals of the piezoelectric layers 70 to grow more favorably.

This provision of the titanium seed layer 68 on the lower electrode film 60 helps to control the priority orientation of the piezoelectric layer 70, so that the piezoelectric layer 70 can have a priority orientation of (100) or (111), when the piezoelectric layer 70 is formed on the lower electrode film 60 with the titanium seed layer 68 sandwiched in between, in the later process. As a result, it is possible to obtain the piezoelectric layer 70 that is preferably used as electromechanical transducer. Note that, the titanium seed layer 68 functions as a seed that promotes the crystallization of the piezoelectric layer 70, and is diffused in the piezoelectric layer 70 after the baking of the piezoelectric layer 70.

Note that, each of the layers 65 to 67 of the lower electrode film 60 as well as the titanium seed layer 68 may be formed by, for example, a DC magnetron sputtering method. In addition, it is preferable that at least the platinum layer 66 and the diffusion-preventive layer 67 of the lower electrode film 60 as well as the titanium seed layer 68 be successively formed without releasing these layers from the vacuum state in the sputtering device. This successive formation of the platinum layer 66 and the diffusion-preventive layer 67 of the lower electrode film 60 as well as the titanium seed layer 68 enhances the adhesion among the platinum layer 66 and, the diffusion-preventive layer 67 of the lower electrode film 60 as well as the titanium seed layer 68. As a result, delamination in the lower electrode film 60 can be prevented.

Next, the piezoelectric layer 70, made of lead zirconate titanate (PZT), is formed. In this embodiment, the piezoelectric layer 70 is formed by a so-called sol-gel method. Specifically, in the sol-gel method, so-called sol is first obtained by dissolving and dispersing a metal-organic compound in a catalyst. Then, the sol thus obtained is turned into gel through application and drying processes. Thereafter, the gel is baked at a high temperature, so that the piezoelectric layer 70, made of the metal oxide, is obtained. Note that, the material of the piezoelectric layer 70 is not limited to the lead zirconate titanate, and may be another piezoelectric material of a relaxor ferroelectric (for example, PMN-PT, PZN-PT and PNN-PT). Moreover, the method of forming the piezoelectric layer 70 is not limited to the sol-gel method, and may be an MOD (Metal-Organic Decomposition) method or the sputtering method. In other words, it is preferable to employ a method including a process in which the piezoelectric layer 70 is formed by performing thermal treatment at a high temperature.

Figure 5A:
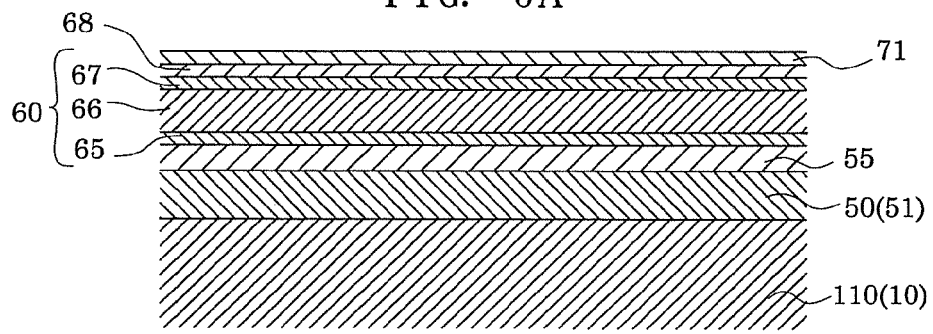
FIGS. 5A to 5D are cross-sectional views each showing the method of fabricating the recording head according to Embodiment 1.
Figure 5B:
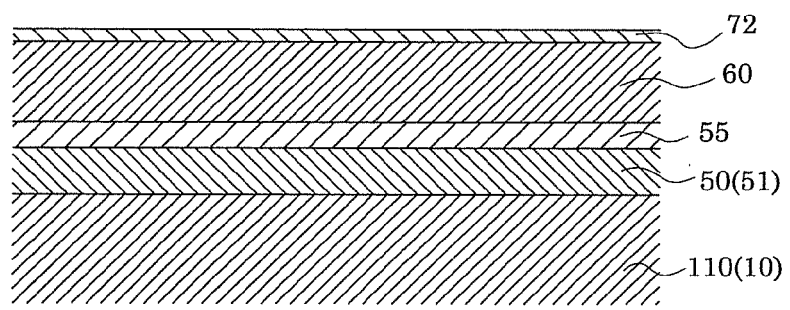

To be more specific, the piezoelectric layer 70 is formed in the following procedures. First, as shown in FIG. 5A, the piezoelectric precursor film 71, which is a PZT precursor film, is formed on the lower electrode film 60. Specifically, a sol (solution) containing a metal-organic compound is applied to the top of the passage-forming substrate 10 on which the lower electrode film 60 has been formed (application process). Next, this piezoelectric precursor film 71 is heated to a predetermined temperature, and then dried for a certain time period (drying process). Thereafter, the dried piezoelectric precursor film 71 is heated to a predetermined temperature, and is then maintained at the predetermined temperature for a certain period of time so as to be degreased (degreasing process) Subsequently, as shown in FIG. 5B, the piezoelectric precursor film 71 is again heated to a predetermined temperature, and is maintained at the predetermined temperature for a certain period of time so as to be crystallized (baking process). As a result, a piezoelectric film 72 is formed.

Note that examples of a heating device that can be used for the drying, degreasing and baking processes, include a hot plate, an RTP (Rapid Thermal Processing) system in which heating is carried out by the radiation of an infrared lamp.

Figure 5C:
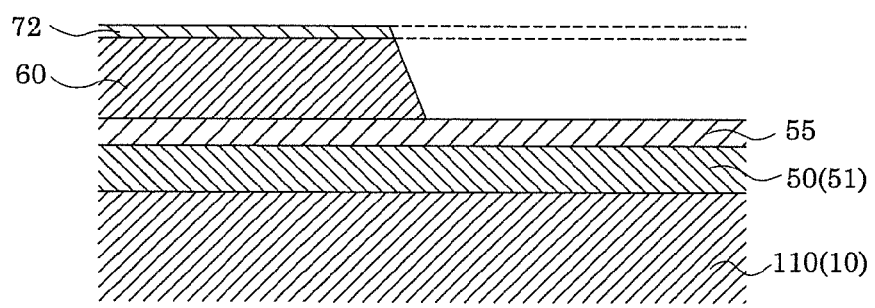

Then, as shown in FIG. 5C, once a first piezoelectric film 72 is formed on the lower electrode film 60, the lower electrode film 60 and the first piezoelectric film 72 are simultaneously patterned, so that the side faces of these films are inclined.

Here, suppose the following case. Patterning is carried out after the titanium seed layer 68 is formed on the lower electrode film 60, and the first piezoelectric film 72 is formed thereon. In this case, since the lower electrode film 60 is patterned through a photo process, ion milling and ashing, the property of the titanium seed layer 68 is changed. Accordingly, when the first piezoelectric film 72 is formed on the titanium seed layer 68 having the changed property, a favorable crystallinity of the first piezoelectric film 72 cannot be obtained. Moreover, crystals of other piezoelectric films 72, sequentially formed on the first piezoelectric film 72, are also grown under the influence of the crystalline state of the first piezoelectric film 72. As a result, the piezoelectric films 72 each having a favorable crystallinity cannot be formed.

In contrast, suppose a case where the lower electrode film 60 and the first piezoelectric film 72 are patterned simultaneously after the first piezoelectric film 72 is formed. In this case, the first piezoelectric film 72 exhibits a great characteristic as a seed for favorably growing crystals of the second and subsequent piezoelectric films 72, as compared with the titanium seed layer 68. Accordingly, even when a very thin layer having a changed property is formed on the surface by patterning, the influence of the layer on the growth of crystals of the second and subsequent piezoelectric films 72 is small.

Figure 5D:
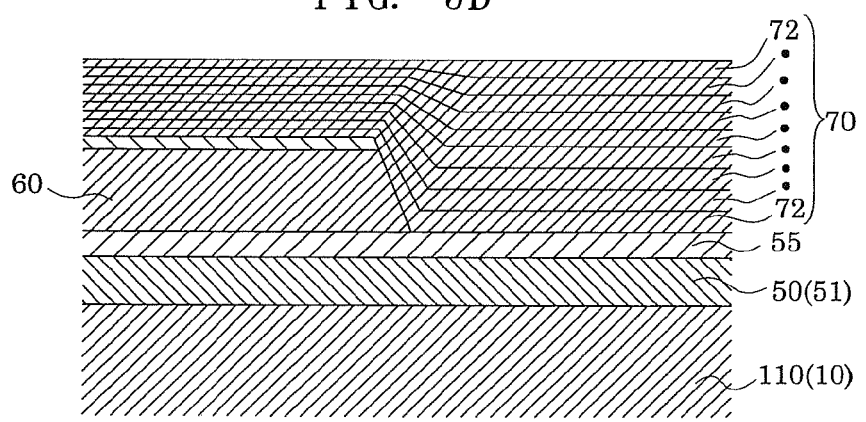

After the patterning, the piezoelectric-film forming process, including the application process, the drying process, the degreasing process and the baking process, is repeated for plural times. As a result, as shown in FIG. 5D, the piezoelectric layer 70, which has a predetermined thickness, and which is constituted of a plurality of piezoelectric films 72, is formed. For example, when the thickness of a film formed by each single application of the sol is approximately 0.1 μm, the total thickness of a piezoelectric layer 70 constituted of 10 piezoelectric films 72 should be approximately 1.1 μm.

Note that, when the lower electrode film 60 and the first piezoelectric film 72 are simultaneously patterned after the first piezoelectric film 72 is formed on the lower electrode film 60, the side surfaces of the lower electrode film 60 and the first piezoelectric film 72 are inclined as described above. This also makes it possible to obtain the following effect. Specifically, when the second piezoelectric film 72 is formed, it is possible to reduce, that is, to ease, an adverse affect on the crystallinity of the second piezoelectric film 72 due to the difference in the foundations in vicinities of the boundaries between the portion where the lower electrode film 60 and the first piezoelectric film 72 are formed, and the other portions. Accordingly, the crystals of the second piezoelectric film 72 are favorably grown in the vicinities of the boundaries, so that the piezoelectric layer 70 having an excellent crystallinity is formed. Moreover, by inclining the side surfaces of the lower electrode film 60 and the first piezoelectric film 72, it is possible to improve the adhesion at the time of forming the second and subsequent piezoelectric films 72. As a result, it is possible to form the piezoelectric layer 70 having excellent adhesion and reliability.

As described above, the adhesion layer 65 made of titanium, the platinum layer 66, and the diffusion-preventive layer 67 made of iridium are first stacked before the piezoelectric layer 70 is formed through baking and crystallization. Then, the lower electrode film 60 is formed of the stacked layers as shown in FIG. 3 when the piezoelectric layer 70 is formed by baking the piezoelectric precursor film 71. Accordingly, the rigidity and toughness of the lower electrode film 60 are enhanced, and the drive durability against repeated driving is thus improved. Moreover, the adhesion layer 65 made of titanium is diffused and oxidized to form the grain boundary layers 64 in the grain boundaries of the columnar crystal grains 61a, while the titanium oxide layer 62 is formed on the upper surface side of the platinum layer 61. Accordingly, the adhesion between the lower electrode film 60 and the piezoelectric layer 70 as well as the adhesion between the lower electrode film 60 and the wafer 110 for the passage-forming substrate (the insulation film 55) are improved.

Figure 6A:
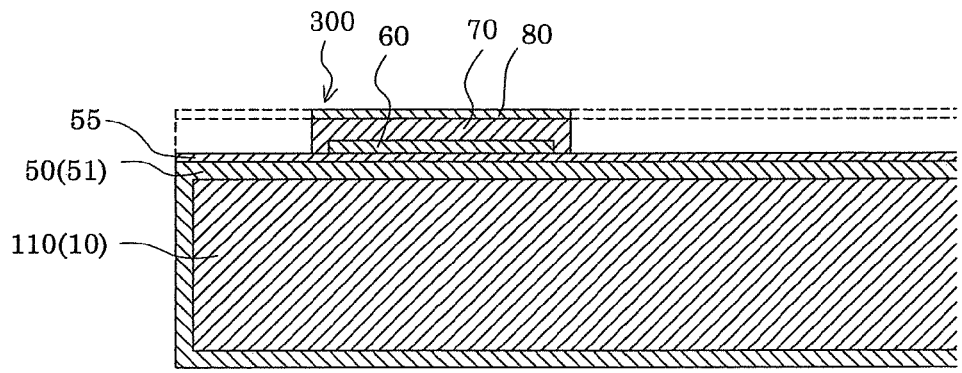
FIGS. 6A to 6C are cross-sectional views each showing the method of fabricating the recording head according to Embodiment 1.

Then, after the piezoelectric layer 70 is formed through the processes shown in FIGS. 5A to 5D, the upper electrode film 80 made of, for example, iridium (Ir) is formed over the entire surface of the wafer 110 for the passage-forming substrate, as shown in FIG. 6A. Then, the piezoelectric layer 70 and the upper electrode film 80 are patterned into regions corresponding to the pressure-generating chambers 12, so that the piezoelectric elements 300 are formed.

Figure 6B:
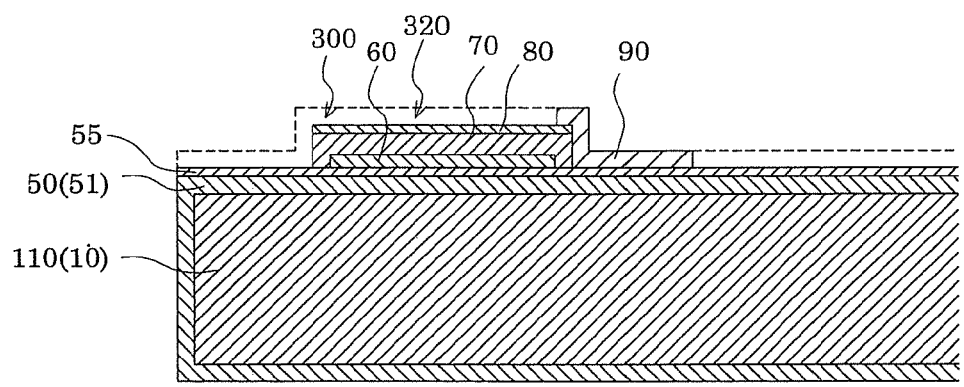

Next, the lead electrode 90 is formed. Specifically, as shown in FIG. 6B, the lead electrode 90 made of, for example, gold (Au) is formed over the entire surface of the wafer 110 for the passage-forming substrate. Then, the lead electrode 90 is patterned for each piezoelectric element 300, with a mask pattern (not illustrated) formed of a resist or the like.

Figure 6C:
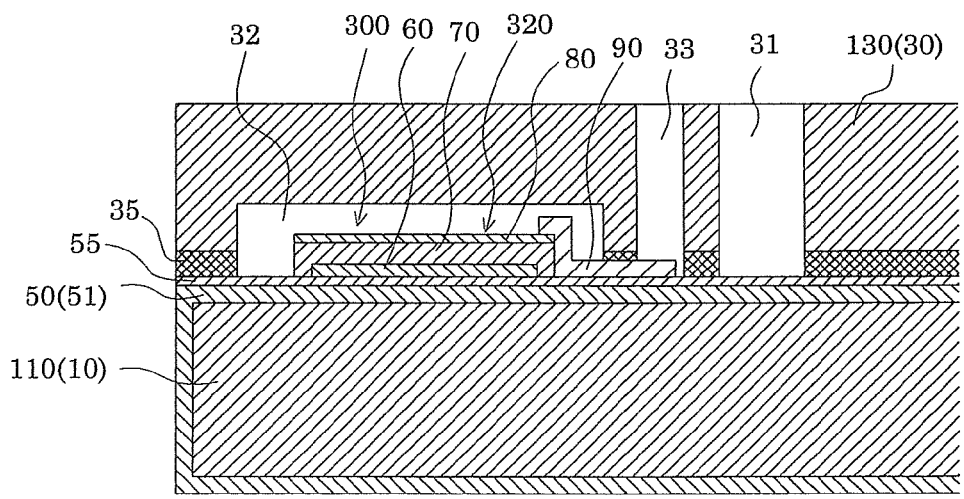

Thereafter, as shown in FIG. 6C, a wafer 130 for a protective plate is bonded to the piezoelectric elements 300 side of the wafer 110 for the passage-forming substrate with the adhesive agent 35. The wafer 130 for the protective plate is a silicon wafer, and is to be formed into a plurality of the protective plates 30. Note that, since the wafer 130 for the protective plate has a thickness of, for example, approximately several hundreds μm, it is possible to significantly improve the rigidity of the wafer 110 for the passage-forming substrate by bonding the wafer 130 for the protective plate thereto. Then, after the wafer 110 for the passage-forming substrate is polished so as to have a certain thickness, wet etching is further performed on the wafer 110 for the passage-forming substrate by using a mixture of hydrofluoric acid and nitric acid, so that the wafer 110 for the passage-forming substrate has a predetermined thickness. For example, in this embodiment, the etching processing is performed on the wafer 110 for the passage-forming substrate, so that the wafer 110 for the passage-forming substrate has a thickness of approximately several tens μm.

Figure 7A:
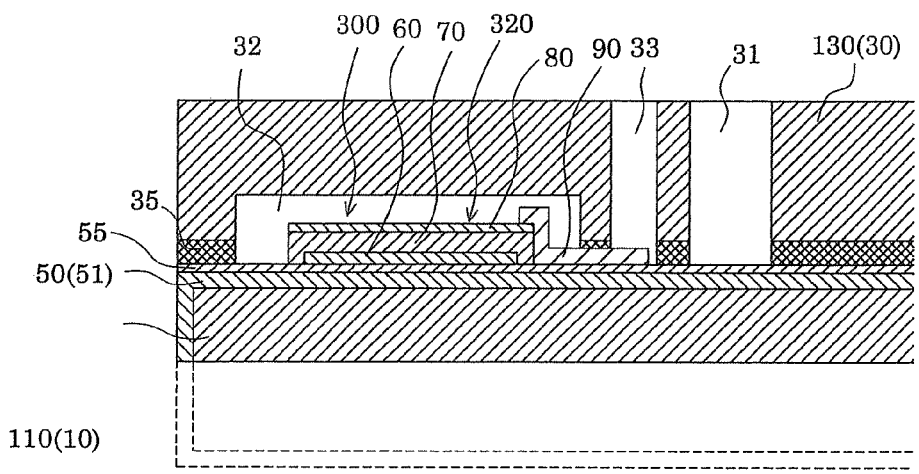
FIGS. 7A to 7C are cross-sectional views each showing the method of fabricating the recording head according to Embodiment 1.
Figure 7B:
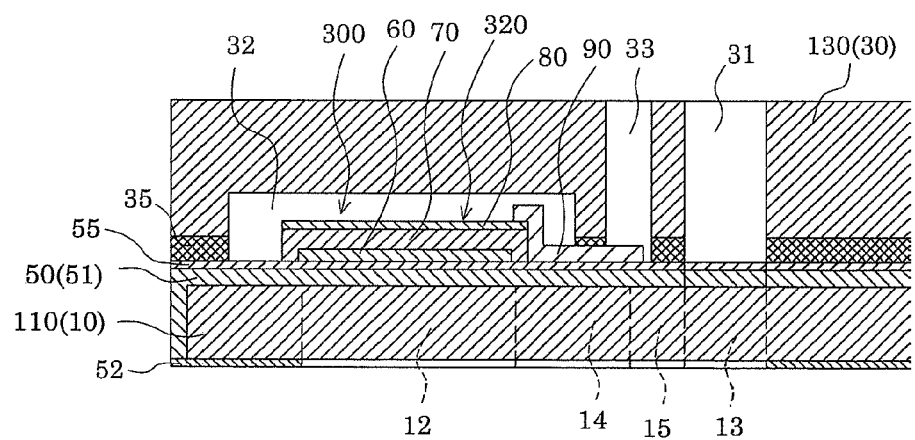
Figure 7C:
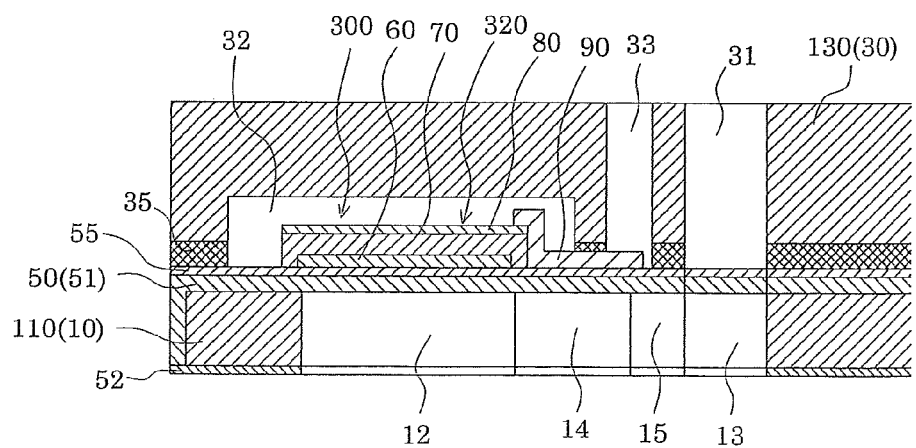

Subsequently, as shown in FIG. 7A, a mask film 52 made of, for example, silicon nitride (SiN) is newly formed on the wafer 110 for the passage-forming substrate, and is then patterned into a predetermined shape. Then, as shown in FIG. 7B, anisotropic etching (wet etching) using an alkaline solution such as KOH is performed on the wafer 110 for the passage-forming substrate using the mask film 52 thus patterned. As a result, the pressure-generating chambers 12, the communicating portions 13, the ink supply paths 14 and the communicating paths 15, which correspond to the piezoelectric elements 300, are formed.

After that, unnecessary parts of the outer peripheral portions of the wafer 110 for the passage-forming substrate and of the wafer 130 for the protective plate, are cut off to be removed by, for example, dicing. Then, the nozzle plate 20 having the nozzle orifices 21 drilled therein is bonded to the surface, opposite to the wafer 130 for the protective plate, of the wafer 110 for the passage-forming substrate. Concurrently, the compliance plate 40 is bonded to the surface of the wafer 130 for the protective plate. The wafer 110 for the passage-forming substrate and the like are divided into pieces of passage-forming substrates 10 and the like, each piece of which has a single chip size as shown in FIG. 1. Consequently, an ink-jet recording head of this embodiment is fabricated.

Figure 8:
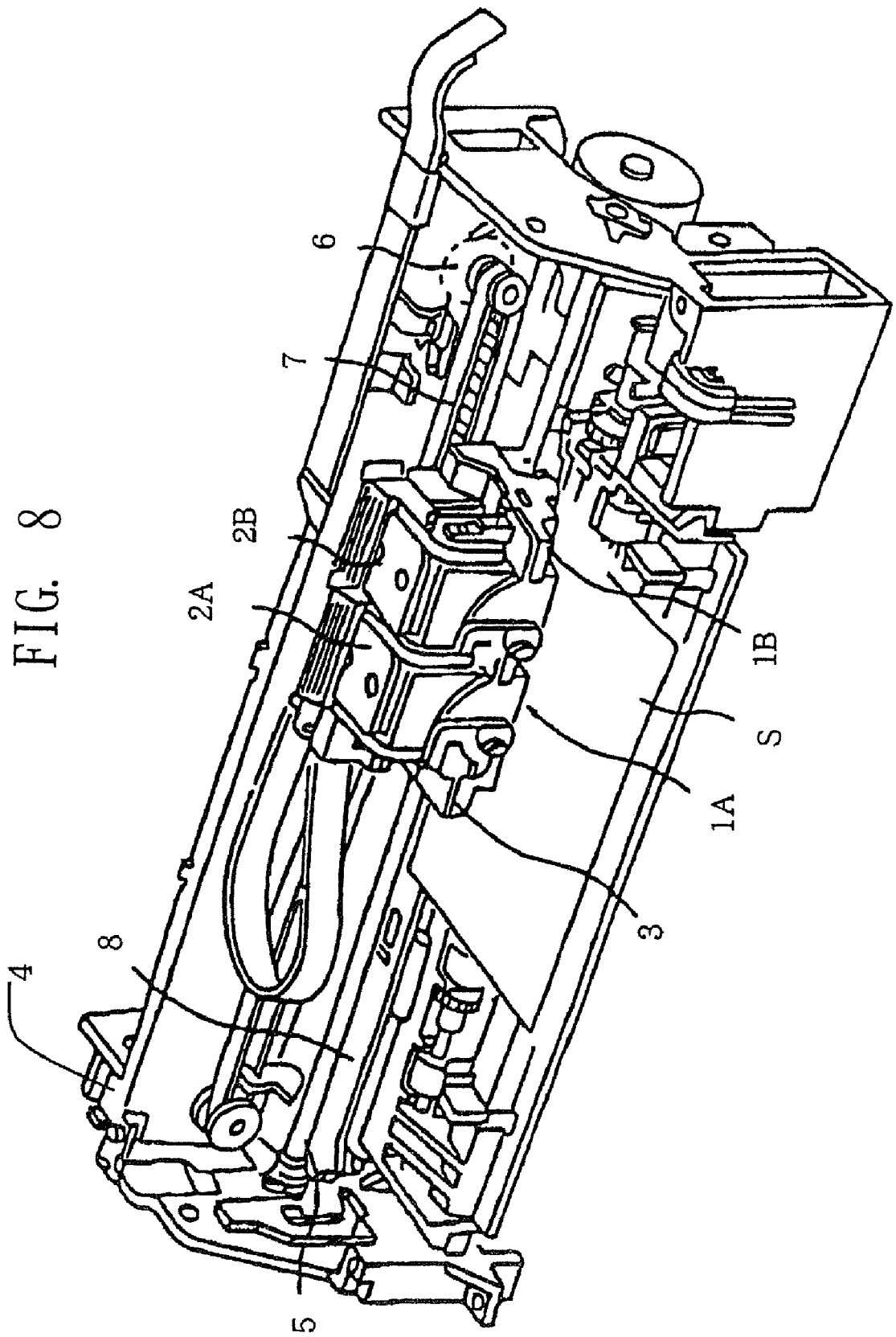
FIG. 8 is a schematic diagram showing a recording apparatus according to Embodiment 1 of the invention.

Note that, such an ink-jet recording head as described above constitutes a part of a recording head unit including an ink path communicating with an ink cartridge or the like, and is installed in an ink-jet recording apparatus. FIG. 8 is a schematic diagram showing an example of the ink-jet recording apparatus. As shown in FIG. 8, cartridges 2A and 2B, each constituting ink supply means, are detachably provided respectively to recording head units 1A and 1B each including the ink-jet recording head. A carriage 3, on which these recording head units 1A and 1B are mounted, is provided on a carriage shaft 5 attached to a main body 4, so as to be axially movable on the carriage shaft 5. The recording head units 1A and 1B eject, for example, a black ink composition and a color ink composition, respectively.

Then, the driving force of a drive motor 6 is transmitted to the carriage 3 via a plurality of unillustrated gears and a timing belt 7, so that the carriage 3 having the recording head units 1A and 1B mounted thereon is moved on and along the carriage shaft 5. On the other hand, a platen 8 is provided to the main body 4 along the carriage shaft 5, so that a recording sheet S, which is a recording medium such as a sheet of paper fed by an unillustrated sheet-feed roller or the like, is transported on the platen 8.

Although, the embodiment of the invention has been described so far, it goes without saying that the invention is not limited to this embodiment. For example, in this embodiment, the ink-jet recording head has been described as an example of the liquid-jet head. However, the invention is intended to be widely applied to liquid-jet heads in general, and may also be applied to a liquid-jet head that ejects a liquid other than ink. Examples of such liquid-jet heads include: various kinds of recording heads used in image recording apparatuses such as printers; color-material-jet heads used in manufacturing color filters of liquid crystal display devices and the like; electrode-material-jet heads used in forming electrodes of organic EL display devices, FED (Field Emission Display) devices, and the like; and bio-organic-material-jet heads used in manufacturing bio-chips. In addition, the invention may be applied, not only to actuator devices, which are to be mounted on such liquid-jet heads as pressure-generating means, but also to actuator devices, which are to be mounted on any kinds of apparatuses. For example, the actuator device according to the invention may be applied also to sensors and the like, in addition to the above-mentioned heads. Furthermore, it goes without saying that the invention may be applied, not only to piezoelectric elements serving as actuator devices used in liquid-jet heads, but also to piezoelectric elements, which are to be installed in any kinds of other devices, for example, microphones, sounding bodies, various kinds of vibrators, and oscillators.

What is claimed is:

1. A piezoelectric element comprising:
   a lower electrode film;
   a piezoelectric layer provided on the lower electrode film; and
   an upper electrode film provided above the piezoelectric layer,
   wherein the lower electrode film includes columnar crystals of platinum, an oxide in grain boundaries of the crystals of platinum, and a layer made of the oxide on the crystals of platinum.

2. The piezoelectric element according to claim 1, wherein the oxide is titanium oxide.

3. The piezoelectric element according to claim 1, wherein the lower electrode film includes a layer made of an iridium oxide above the crystals of platinum.

4. The piezoelectric element according to claim 1, further comprising a substrate formed below the lower electrode film,
   wherein the oxide exists less on the substrate side in the grain boundaries of the crystals of platinum, and exists more on the piezoelectric layer side in the grain boundaries of the crystals of platinum.

5. An actuator device comprising the piezoelectric element according to claim 1, which can be flexurally deformed.

6. The actuator device according to claim 5 further comprising a zirconium oxide layer, which constitutes a part of a vibration plate, on the lower side of the lower electrode film of the piezoelectric element.

7. The actuator device according to claim 6, wherein the piezoelectric element is formed by baking: an adhesion layer, which is provided on the zirconium oxide layer; a platinum layer, which is provided on the adhesion layer; an iridium layer, which is provided on the platinum layer; a titanium seed layer, which is provided on the iridium layer; and a piezoelectric precursor film, which is provided on the titanium seed layer, and which is to serve as the piezoelectric layer.

8. A liquid-jet head comprising:
   the actuator device according to claim 5; and
   a passage-forming substrate, which is provided with the actuator device on one surface thereof, and which includes a pressure-generating chamber communicating with a nozzle orifice for ejecting a droplet.

9. A liquid-jet apparatus comprising the liquid-jet head according to claim 8.

* * * * *